(12) United States Patent
Wu

(10) Patent No.: US 7,588,864 B2
(45) Date of Patent: Sep. 15, 2009

(54) MASK, METHOD OF MANUFACTURING MASK, AND LITHOGRAPHIC PROCESS

(75) Inventor: Tzong-Hsien Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 704 days.

(21) Appl. No.: 10/904,924

(22) Filed: Dec. 6, 2004

(65) Prior Publication Data

US 2006/0121360 A1 Jun. 8, 2006

(51) Int. Cl.
*G03F 1/00* (2006.01)
(52) U.S. Cl. ......................................................... 430/5
(58) Field of Classification Search ....................... 430/5
See application file for complete search history.

(56) References Cited

U.S. PATENT DOCUMENTS

| | | | | |
|---|---|---|---|---|
| 5,362,591 A | * | 11/1994 | Imai et al. ..................... 430/5 |
| 5,405,721 A | * | 4/1995 | Pierrat ........................... 430/5 |
| 5,472,811 A | * | 12/1995 | Vasudev et al. ............... 430/5 |
| 5,942,356 A | * | 8/1999 | Mitsui et al. .................. 430/5 |
| 6,800,405 B2 | * | 10/2004 | Kobayashi ..................... 430/5 |
| 6,864,020 B1 | * | 3/2005 | Taravade et al. .............. 430/5 |
| 6,908,715 B2 | * | 6/2005 | Rolfson ......................... 430/5 |
| 2002/0122995 A1 | * | 9/2002 | Mancini et al. ............... 430/5 |
| 2004/0161678 A1 | * | 8/2004 | Misaka .......................... 430/5 |

* cited by examiner

*Primary Examiner*—Mark F Huff
*Assistant Examiner*—Stewart A Fraser
(74) *Attorney, Agent, or Firm*—Jianq Chyun IP Office

(57) ABSTRACT

A mask of a lithographic process, a method of manufacturing the mask and a lithographic process by using the mask are provided. The mask includes a substrate, a first polarization layer and a second polarization layer is provided. The first polarization layer for allowing a transmission of a first polarization direction of light and avoiding a transmission of a second polarization direction of light. The second polarization layer for avoiding a transmission of the first polarization direction of light, wherein the second polarization layer is patterned with a predetermined pattern.

26 Claims, 7 Drawing Sheets

MASK, METHOD OF MANUFACTURING MASK, AND LITHOGRAPHIC PROCESS

BACKGROUND OF THE INVENTION

1. Field of the Invention

The present invention is related to a mask of a lithographic process, a method of manufacturing the mask and a lithographic process by using the mask. More particularly, the present invention relates to a mask of a lithographic process, a method of manufacturing the mask and a lithographic process by using the mask, wherein the mask comprises a layer having a first polarization direction of light and a patterned layer having a second polarization direction of light.

2. Description of Related Art

Conventionally, lithographic and etch process is important in a semiconductor manufacturing process for patterning a film. Generally, in the semiconductor process, a photoresist layer is formed over a film formed on a semiconductor substrate that will be patterned. Next, the photoresist layer is exposed using a mask to transfer a specific pattern on the mask onto the surface of the photoresist layer. After the photoresist layer is trimmed with respect to the specific pattern transferred, the remaining patterned photoresist layer is used as an etching mask layer for etching an underlying film. Finally, after etching the film using the patterned photoresist layer as an etching mask, the patterned photoresist layer is stripped. Thus, the film is patterned using lithographic and etch process described above.

FIG. 1 is a schematic cross-sectional view of a conventional mask. FIG. 2 is a schematic view of a conventional lithographic process. Referring to FIG. 1, the conventional mask 100 includes a transparent glass 102, and a patterned chromium layer 104 formed on the glass. The patterned chromium layer 104 includes a specific pattern that will be transferred onto the photoresist layer 206 shown in FIG. 2. In addition, a patterned chromium dioxide layer 106 may also be formed over the surface of the patterned chromium layer 104 to prevent the reflection of the light used in the lithographic from the surface of the patterned chromium layer 104.

Referring to FIG. 2, a light 212 is adopted for transferring the specific pattern on the mask 100 onto a substrate 202 via a lens 208. A layer 204 to be patterned is formed on the substrate 202, and a photoresist layer 206 is formed on the layer 204. FIG. 3 is a plot of a normalized light intensity generated via a conventional mask. Referring to FIG. 3, the photoresist layer 206 is exposed by a light 304 illuminated thereon. The light 304 is formed by illuminating the light 212 via a specific pattern 302 (i.e., constructed by the patterned chromium dioxide layer 106 formed on the mask 100) and focusing the transmitted light 216a, 216b via the lens 208. In general, the resolution of line width or critical dimension formed in the layer 204 after etch process is dependent on the resolution of the light 304. It is noted that the resolution of the light 304 generated by the conventional mask 100 is poor since the normalized light intensity (i.e., the image contrast) of the light 304 is relatively small. The reason why the normalized light intensity of the light 304 is small will be described hereinafter. The light 212 includes two directions of polarization, one has traverse electric mode TE212 (illustrated in a direction perpendicular to the plane) and the other has traverse magnetic mode TM212 (illustrated perpendicular to the light 212 and the TE212). The light 304 is generated from the transmitted light 216a, 216b, however, the resolution of the light 304 is reduced by the unexpected polarizations TM216a and TM216b. In general, the polarizations TM216a and TM216b are almost perpendicular to each other, which make low image contrast of optical interference of the combination of TM216a and TM216b.

Recently, as the semiconductor process advances, the line width or the critical dimension of the semiconductor structure is being minimized rapidly to increase the integration of the semiconductor device. However, with the reduction of the line width, a variety of problems arise in a conventional lithographic and etch process. In general, reducing the wavelength of light 212 may improve the resolution of line width or critical dimension. For example, pattern with resolution of line/space dimension of about 0.5 µm may be formed by using i-line laser with a wavelength of 365 nm. Furthermore, pattern with resolution of line/space dimension of about 0.25 µm may be formed by using KrF laser having a wavelength of 248 nm or ArF laser having a wavelength of 193 nm. However, as the line width or critical dimension of the recently semiconductor process is reduced to 100 nm, 90 nm, 60 nm or less, to reduce the wavelength of the light 212 will make the lithographic process more complicated and increase the cost drastically.

In addition, as the pitch of patterns on mask 100 (i.e., proportional to the intervals between the patterned chromium layers 104) reduces, the numerical aperture (NA) of the lens 208 used in the lithographic process has to be increased to enhance the resolution of the line width or critical dimension. However, as the numerical aperture (NA) increases, the depth of focus (DOF) in the photoresist layer 206 is reduced, i.e., the depth of the exposed pattern in the photoresist layer 206 may not enough. Furthermore, the image contrast of the exposed pattern on the photoresist layer 206 may be degraded and the process window of the lithographic process and etch process may decrease. In addition, chromium is a contamination that may pollute the environment. Accordingly, to improve the conventional lithographic process and the mask using thereof, and to develop a contamination free mask is highly desired.

SUMMARY OF THE INVENTION

Therefore, the present invention is directed to a mask of a lithographic process for providing a high resolution of the light for exposing a photoresist layer, and the mask is low contaminated.

In addition, the present invention is also directed to a method of manufacturing a mask of a lithographic process for providing a high resolution of the light for exposing a photoresist layer, and the mask is low contaminated.

Moreover, the present invention is directed to a lithographic process, wherein a mask used in the process may providing a high resolution of the light for exposing a photoresist layer, and the mask is low contaminated.

According to one embodiment of the present invention, a mask of a lithographic process comprising a substrate, a first polarization layer and a second polarization layer is provided. The first polarization layer for allowing a transmission of a first polarization direction of light and avoiding a transmission of a second polarization direction of light. The second polarization layer for avoiding a transmission of the first polarization direction of light, wherein the second polarization layer is patterned with a predetermined pattern.

In one embodiment of the present invention, the first polarization direction of light and the second polarization direction of light are mutually perpendicular.

In one embodiment of the present invention, the first polarization direction of light comprises a traverse electric (TE) polarization direction of an incident light on a surface of the mask.

In one embodiment of the present invention, the second polarization direction of light comprises a traverse magnetic (TM) polarization direction of an incident light on a surface of the mask.

In one embodiment of the present invention, the substrate comprises a transparent substrate such as a glass substrate or a quartz substrate.

In one embodiment of the present invention, a material of the first polarization layer or the second polarization layer comprises calcium fluoride ($CaF_2$), magnesium fluoride ($MgF_2$), or lithium fluoride (LiF).

According to one embodiment of the present invention, a method of manufacturing a mask of a lithographic process is provided. First, a substrate is provided, a first polarization layer is formed over the substrate, and a second polarization layer is formed over the etch stop layer. Then, the second polarization layer is patterned with a predetermined pattern. The first polarization layer is adopted for allowing a transmission of a first polarization direction of light and avoiding a transmission of a second polarization direction of light, and the second polarization layer is adopted for avoiding a transmission of the first polarization direction of light.

In one embodiment of the present invention, after the first polarization layer is formed and before the second polarization layer is formed, further comprises a step of forming an etch stop layer between the first polarization layer and the second polarization layer, and patterning the etch stop layer with the predetermined pattern.

In one embodiment of the present invention, the first polarization direction of light and the second polarization direction of light are mutually perpendicular.

In one embodiment of the present invention, the first polarization direction of light comprises a traverse electric (TE) polarization direction of an incident light on a surface of the mask.

In one embodiment of the present invention, the second polarization direction of light comprises a traverse magnetic (TM) polarization direction of an incident light on a surface of the mask.

In one embodiment of the present invention, the substrate comprises a transparent substrate such as a glass substrate or a quartz substrate.

In one embodiment of the present invention, a material of the first polarization layer or the second polarization layer comprises calcium fluoride ($CaF_2$), magnesium fluoride ($MgF_2$), or lithium fluoride (LiF).

According to one embodiment of the present invention, a lithographic process is provided. First, an incident light is provided. Then, mask comprising a substrate, a first polarization layer and a second polarization layer is provided. The first polarization layer for allowing a transmission of a first polarization direction of light and avoiding a transmission of a second polarization direction of light. The second polarization layer for avoiding a transmission of the first polarization direction of light, wherein the second polarization layer is patterned with a predetermined pattern.

In one embodiment of the present invention, the first polarization direction of light and the second polarization direction of light are mutually perpendicular.

In one embodiment of the present invention, the first polarization direction of light comprises a traverse electric (TE) polarization direction of an incident light on a surface of the mask.

In one embodiment of the present invention, the second polarization direction of light comprises a traverse magnetic (TM) polarization direction of an incident light on a surface of the mask.

In one embodiment of the present invention, the substrate comprises a transparent substrate such as a glass substrate or a quartz substrate.

In one embodiment of the present invention, a material of the first polarization layer or the second polarization layer comprises calcium fluoride ($CaF_2$), magnesium fluoride ($MgF_2$), or lithium fluoride (LiF).

In one embodiment of the present invention, the incident light is generated by an annular light generator or a dipole light generator.

In one embodiment of the present invention, a resolution of line/space dimension or critical dimension of about 90 nm is generated by using the incident light comprising a wavelength of about 248 nm.

In one embodiment of the present invention, a resolution of line/space dimension or critical dimension of about 65 nm is generated by using the incident light comprising a wavelength of about 193 nm.

Accordingly, in the present invention, since the polarization direction of the first polarization layer and the patterned second polarization layer are mutually perpendicular, the resolution of the light for exposing the photoresist layer is excellent due to the unexpected TM polarization light is eliminated. In addition, the mask of the present invention is chromium free and will not pollute the environment. Therefore, the mask of the present invention may be provided with the conventional light source and the high numerical aperture (NA) illumination to achieve narrower line width and critical dimension.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 4:
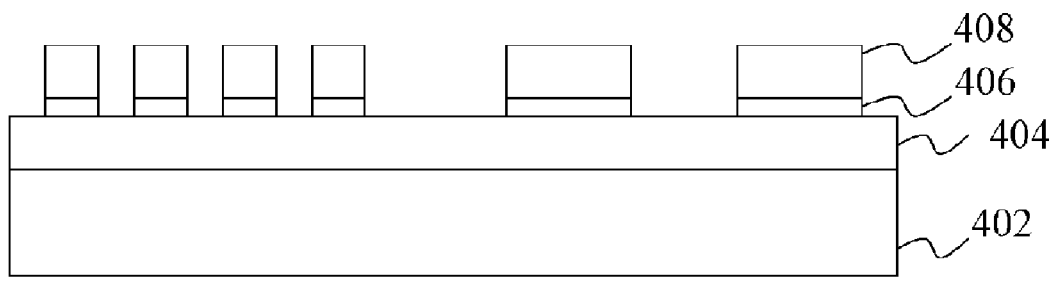
FIG. 4 is a schematic cross-sectional view of a mask according to one embodiment of the present invention.
Figure 5:
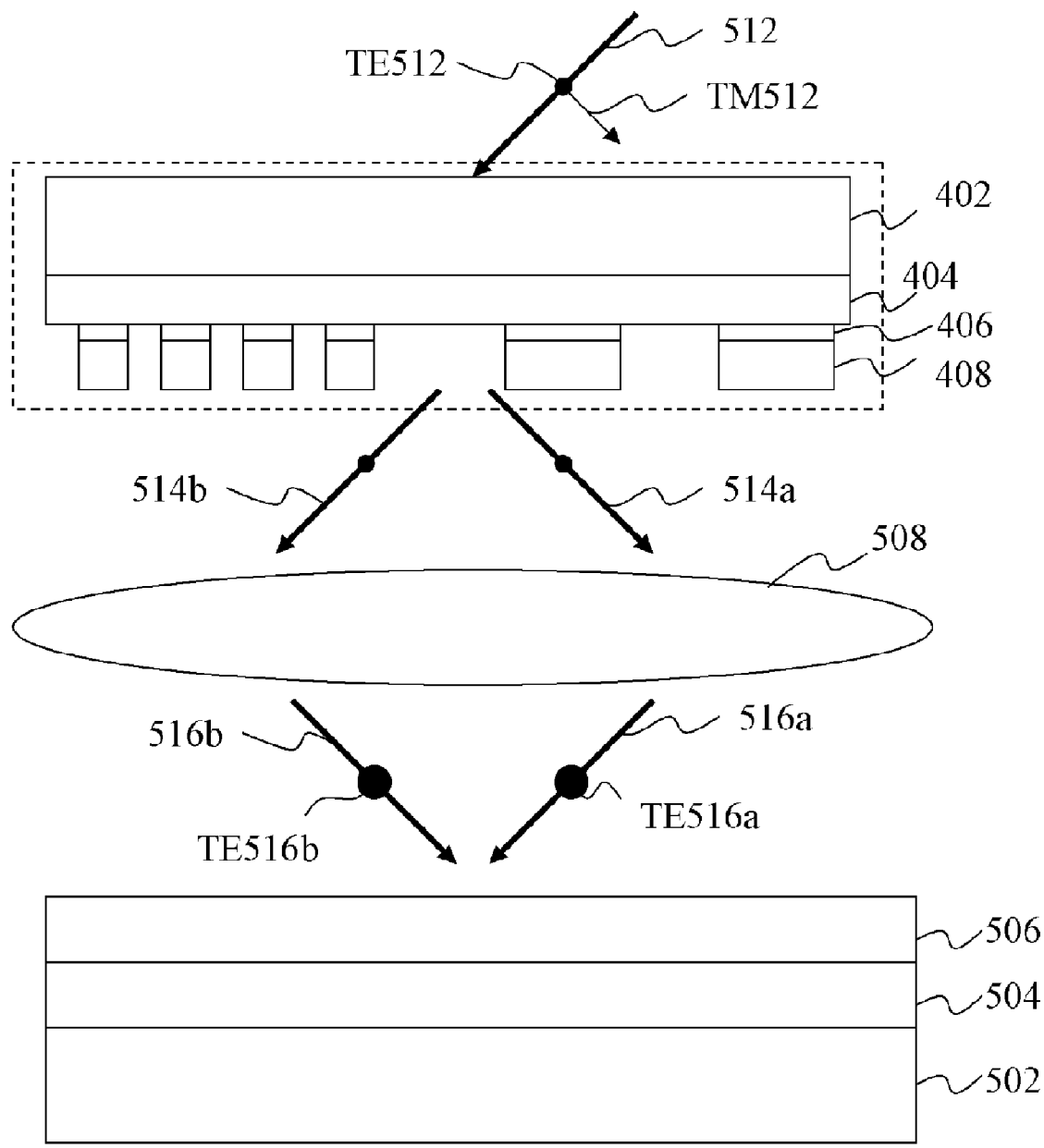
FIG. 5 is a schematic view of a lithographic process according to one embodiment of the present invention.

FIG. 4 is a schematic cross-sectional view of a mask according to one embodiment of the present invention. FIG. 5 is a schematic view of a lithographic process according to one embodiment of the present invention. Referring to FIG. 4, a mask 400 may comprise, for example, a substrate 402, a first polarization layer 404, and a second polarization layer 408. Optionally, an etch stop layer 406 may also be formed between the first polarization layer 404 and the second polarization layer 408. Referring to FIG. 5, an incident light 512 including a traverse electric (TE) polarization light TE512 and a traverse magnetic (TM) polarization light TM 512 is adopted for transferring a predetermined pattern on the mask 400 onto a substrate 502 via a lens 508. A semiconductor layer 504 to be patterned is formed over the substrate 502, and a photoresist layer 506 is formed over the layer 504.

In one embodiment of the present invention, the substrate 402 may comprise a transparent substrate such as a glass substrate or a quartz substrate.

Referring to FIG. 4 and FIG. 5, the first polarization layer 404 is adopted for allowing a transmission of the light TE512 and avoiding a transmittance of the light TM 512. The second polarization layer 408 is adopted for avoid a transmission of the light TE512, wherein the second polarization layer 408 is patterned with a predetermined pattern to be transferred onto the photoresist layer 506. The material of the first polarization layer 404 or the second polarization layer 408 may comprises calcium fluoride (CaF$_2$), magnesium fluoride (MgF$_2$), or lithium fluoride (LiF).

Figure 6:
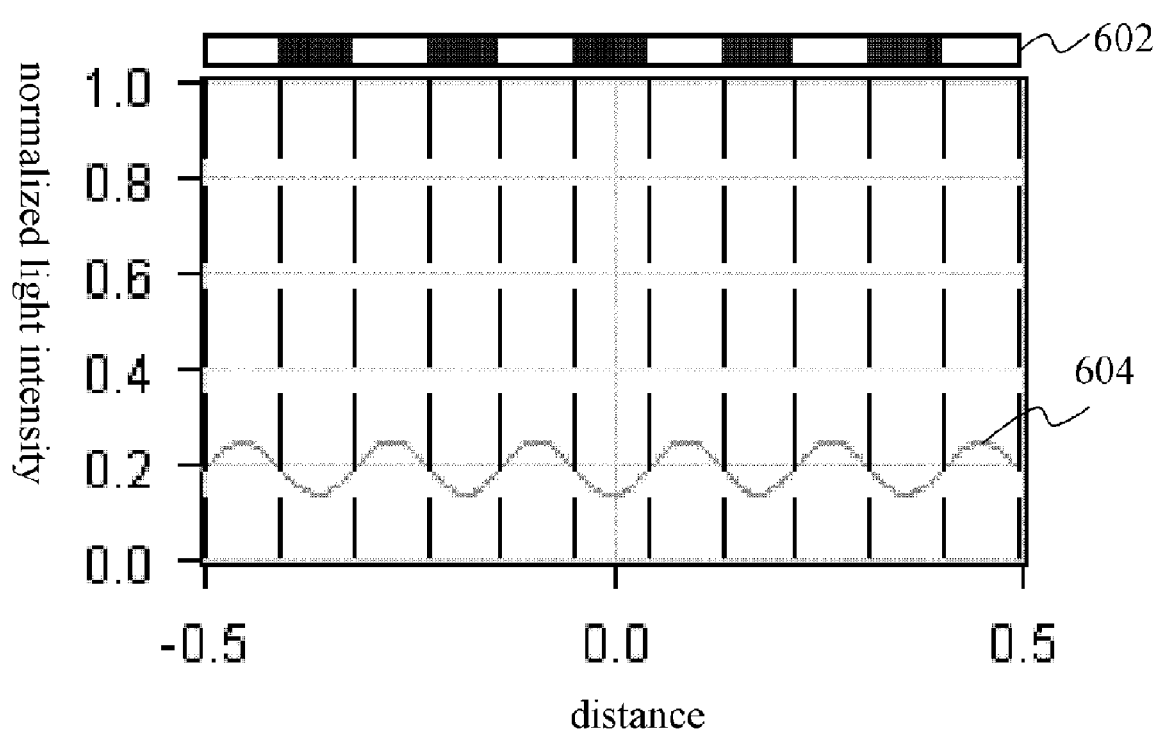
FIG. 6 is a plot of a normalized light intensity generated via a mask according to one embodiment of the present invention.

FIG. 6 is a plot of a normalized light intensity generated via a mask according to one embodiment of the present invention. Referring to FIG. 6, the photoresist layer 506 is exposed by a light 604 illuminated thereon. The light 604 is formed by illuminating the light 612 via a specific pattern 602 (wherein the specific pattern 602 may be constructed by the second polarization layer 408 of the mask 400) and focusing the transmitted light 516*a*, 516*b* via the lens 508.

Referring to FIG. 5 the light 512 comprises two polarization lights, a TE polarization light TE512 (illustrated in a direction perpendicular to the plane) and a TM polarization light TM512 (illustrated perpendicular to the light 512 and the light TE512). After the light 512 passes through the first polarization layer 404 of the mask 400, the light TE512 is allowed to transmit the first polarization layer 404, but the light TM512 is forbidden to transmit the first polarization layer 404. In addition, the second polarization layer 408 comprises the predetermined pattern to be transferred to the photoresist layer 506, and thus a portion of the light TE512 may pass the second polarization layer 408. Therefore, the lights 514*a* and 514*b* are generated, wherein the lights 514*a* and 514*b* only comprises a polarization direction TE (illustrated in a direction perpendicular to the plane).

Figure 1:
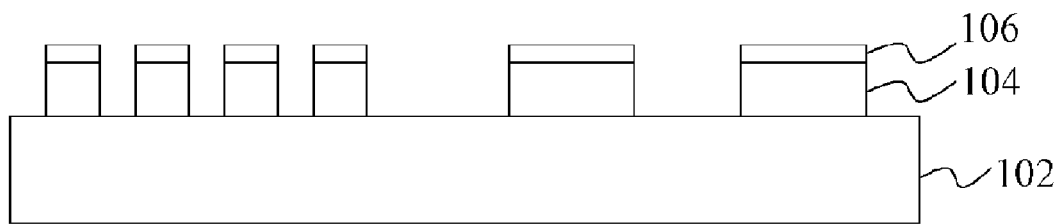
FIG. 1 is a schematic cross-sectional view of a conventional mask.
Figure 2:
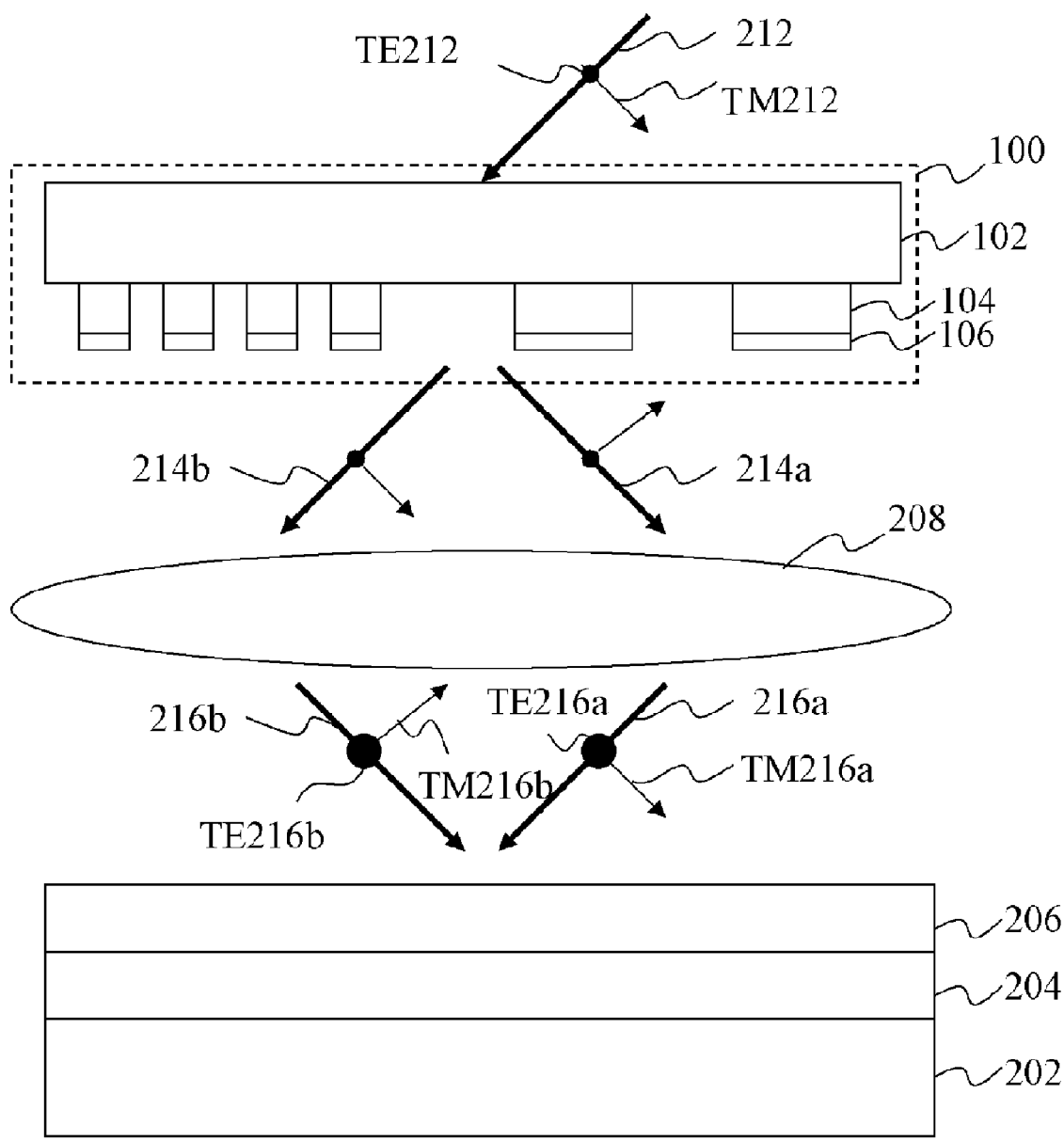
FIG. 2 is a schematic view of a conventional lithographic process.
Figure 3:
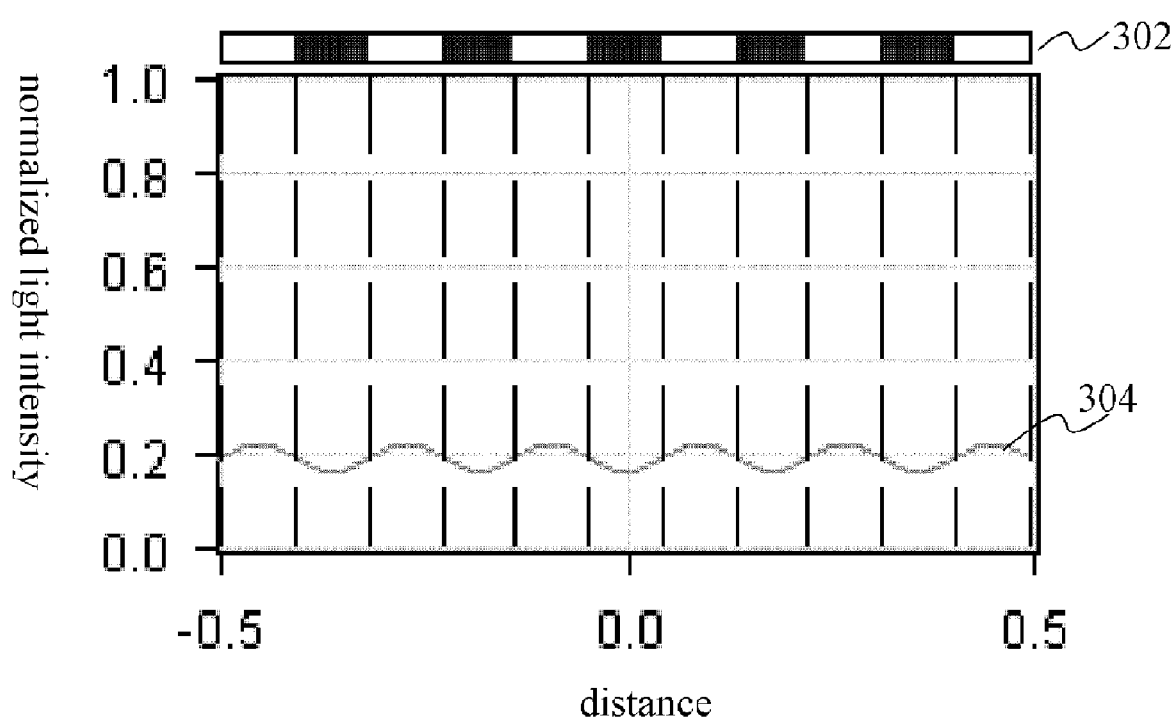
FIG. 3 is a plot of a normalized light intensity generated via a conventional mask.

Thereafter, the lights 514*a* and 514*b* are focused to generate the lights 516*a* and 516*b*, therefore the light 604 is formed. It should be noted that since the lights 516*a* and 516*b* only comprises a polarization direction TE, the resolution of the light 604 is better due to the conventional unexpected light with TM polarization are eliminated. In one exemplary embodiment of the present invention, the light 604 of FIG. 6 is generated by using the mask 400, and the light 304 of FIG. 3 is generated by using the conventional mask 100. In addition, the feature of the pattern 602 is similar to that of the pattern 302, and the process parameter of embodiments of FIG. 6 and FIG. 3 are the same. It should be noted that, the resolution of the light 604 is better than that of the light 304 since the normalized light intensity (i.e., the image contrast) of the light 604 is higher than that of the light 604.

Figure 7:
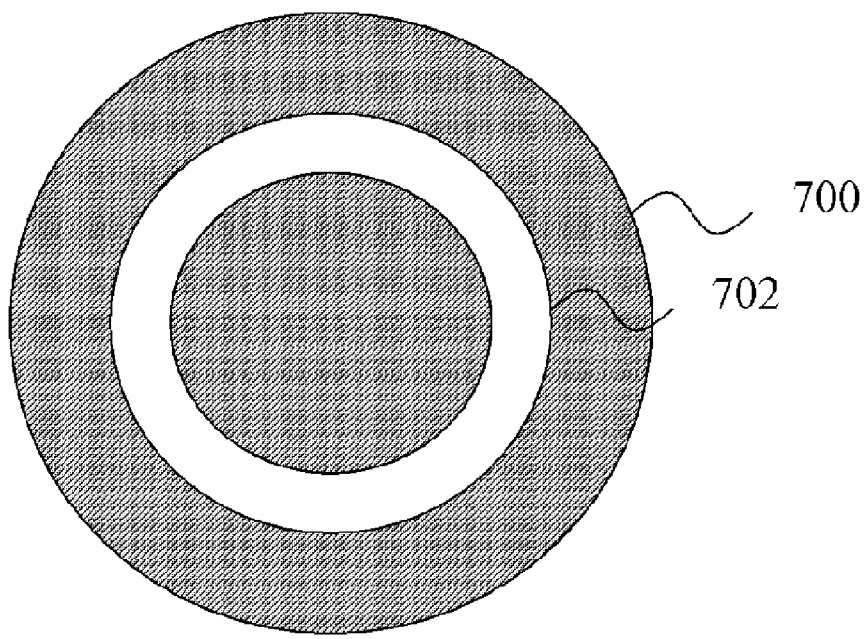
FIG. 7 is a schematic view of a light generator of a lithographic process.

FIG. 7 is a schematic view of a light generator of a lithographic process. Referring to FIG. 7, in the embodiment described above, the light used to illuminate the masks 100 and 400 are generated by illuminating a light via the annular light generator 702, wherein only the area 702 is transparent for light.

Figure 8:
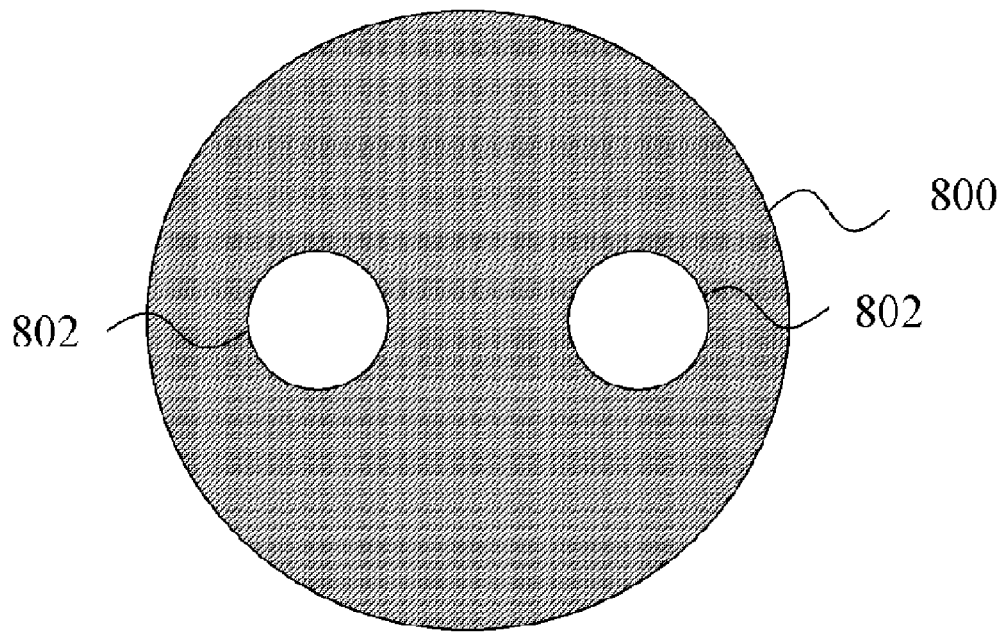
FIG. 8 is a schematic view of another light generator of a lithographic process.
Figure 9:
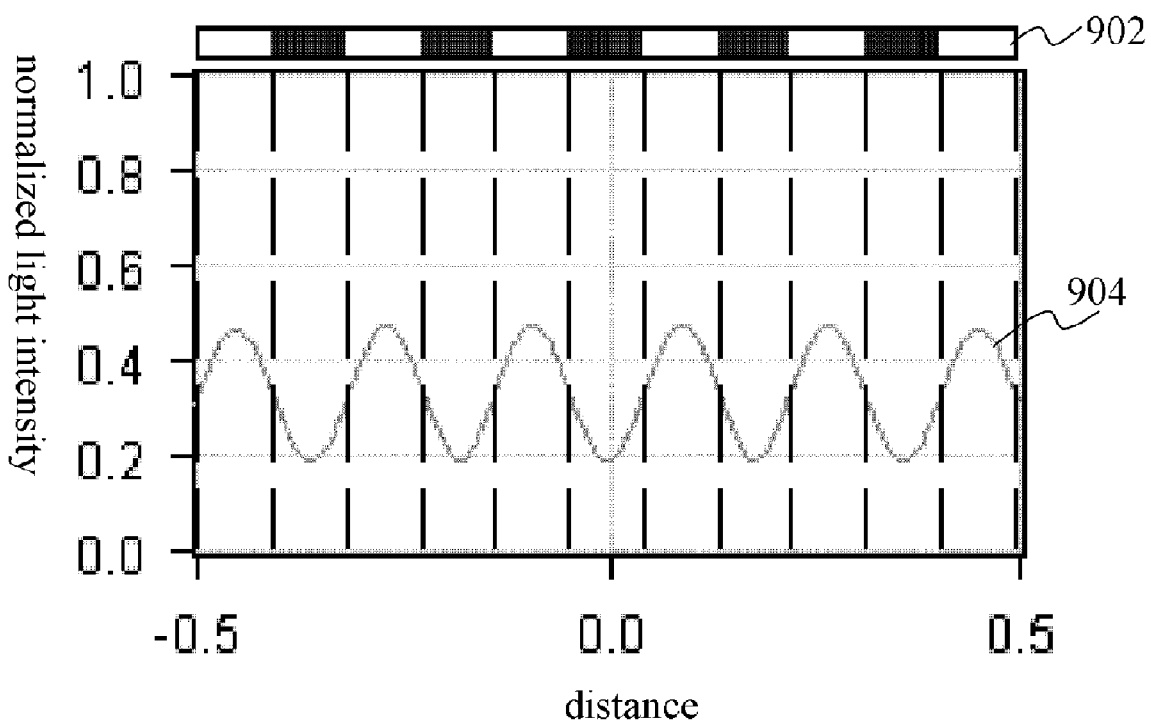
FIG. 9 is a plot of a normalized light intensity generated via the mask 100.
Figure 10:
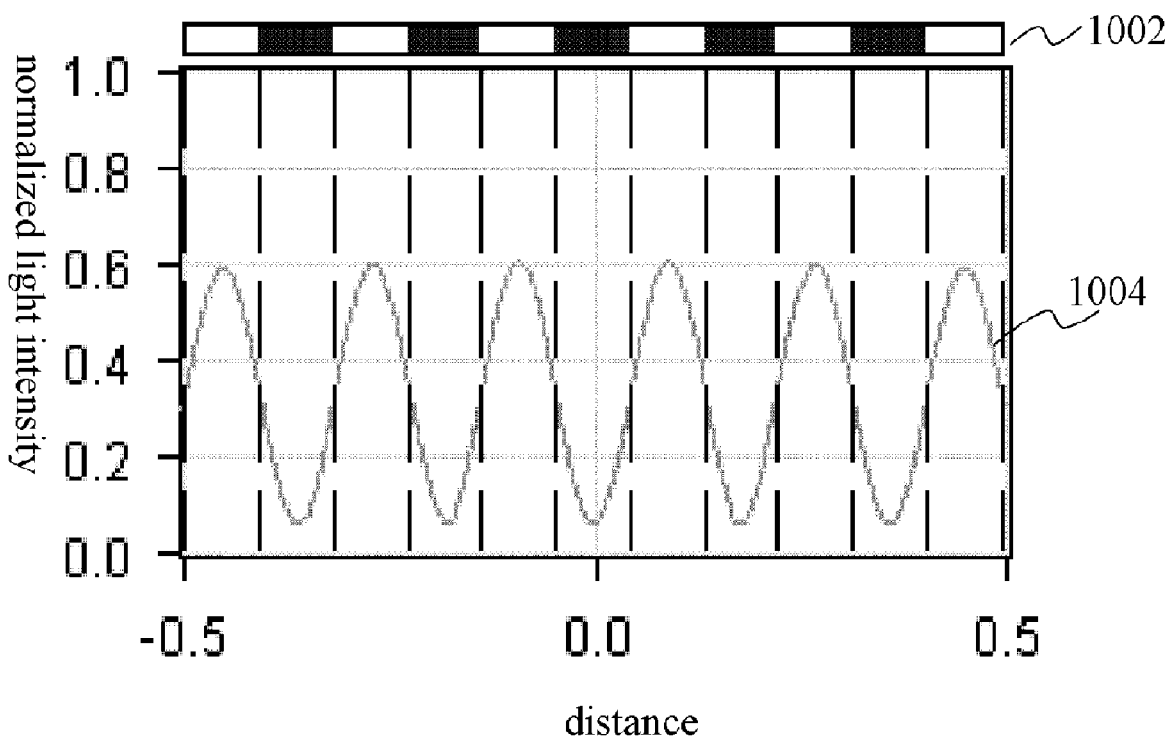
FIG. 10 is a plot of a normalized light intensity generated via a mask according to one embodiment of the present invention.

FIG. 8 is a schematic view of another light generator of a lithographic process. FIG. 9 is a plot of a normalized light intensity generated via the mask 100. FIG. 10 is a plot of a normalized light intensity generated via a mask according to one embodiment of the present invention. Referring to FIG. 8, in another embodiment of the present invention, the light used to illuminate the masks 100 and 400 may also be generated by illuminating a light via the dipole light generator 802, wherein only the area 802 is transparent for light. In one exemplary embodiment of the present invention, the light 1004 of FIG. 10 is generated by using the light generator 802 and the mask 400 including the pattern 1002, and the light 904 of FIG. 9 is generated by using the light generator 802 and the conventional mask 100 with the pattern 902. In addition, the feature of the pattern 1002 is similar to that of the pattern 902, and the process parameter of embodiments of FIG. 10 and FIG. 9 are the same. It should be noted that, the resolution of the light 1004 is much better than that of the light 904 since the normalized light intensity (i.e., the image contrast) of the light 1004 is higher than that of the light 904.

In one embodiment of the present invention, a pattern with resolution of line/space dimension of about 90 nm may be formed by using KrF laser having a wavelength of 248 nm. Furthermore, a pattern with resolution of line/space dimension of about 65 nm may be formed by using ArF laser having a wavelength of 193 nm.

It is noted that the polarization direction of the first polarization layer 404 and the second polarization layer 408 may not be limited to the embodiment described above. In one embodiment of the present invention, the polarization direction of the first polarization layer 404 and the second polarization layer 408 are mutually perpendicular.

Figure 11A:
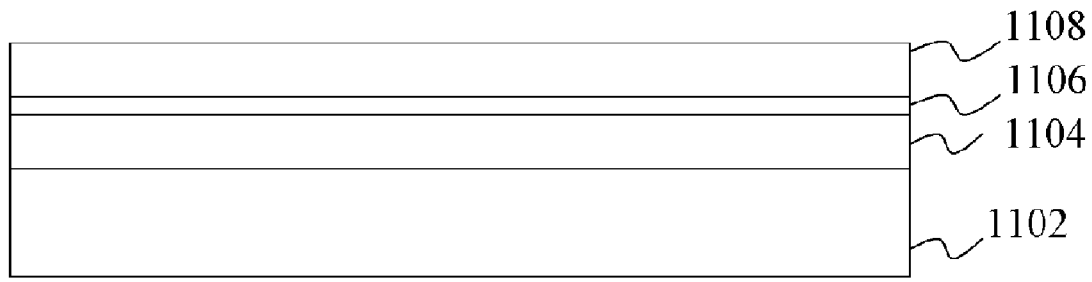
FIGS. 11A to 11C are schematic cross-sectional views illustrating a process flow of manufacturing a mask according to one embodiment of the present invention.
Figure 11B:
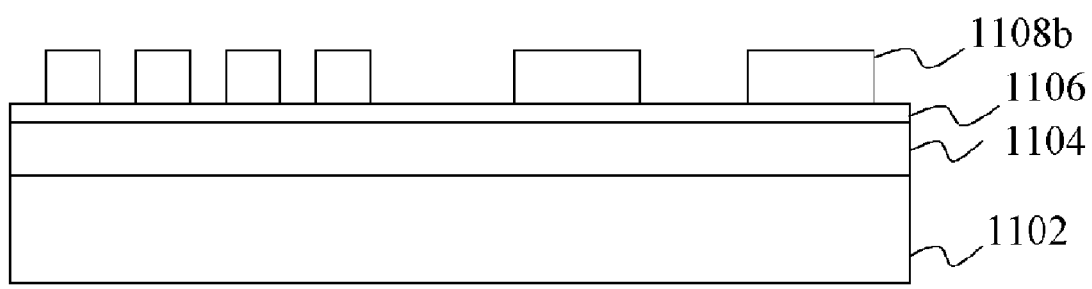
Figure 11C:
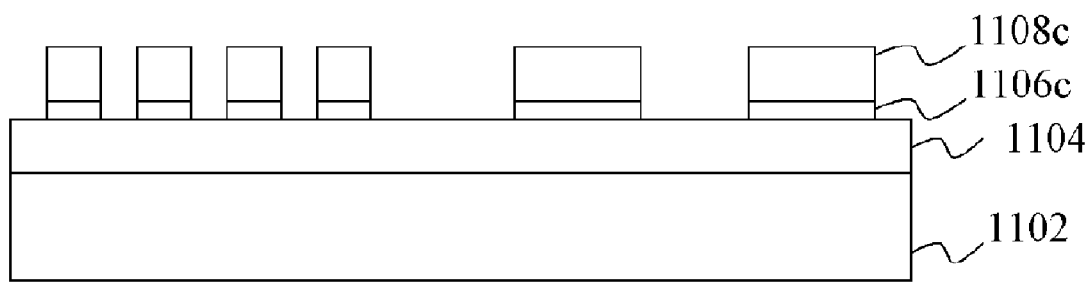

According to one embodiment of the present invention, a method of manufacturing a mask is provided. FIGS. 11A to 11C are schematic cross-sectional views illustrating a process flow of manufacturing a mask according to one embodiment of the present invention. Referring to FIG. 11A, a mask 1100*a* may be formed by, for example, providing a substrate 1102, forming a first polarization layer 1104 over the substrate, forming an etch stop layer 1106 over the first polarization layer 1104, and forming a second polarization layer 1108 over the etch stop layer 1106. It is noted that the forming of the etch stop layer 1106 is optionally. The first polarization layer 1104 is adopted for allowing a transmission of a TE polarization light of an incident light, and avoiding a transmittance of a TM polarization light TM of the incident light. The second polarization layer 1108 is adopted for avoid a transmission of the TE polarization light.

Referring to FIG. 11B, the second polarization layer 1108 is patterned with a predetermined pattern to be transferred onto a photoresist layer (e.g., the photoresist layer 506) by using the etch stop layer 1106 as an etch stop. Therefore, the mask 1100b is formed, wherein the second polarization layer 1108b is patterned. Thereafter, referring to FIG. 11C, the etch stop layer 1106 is patterned with the predetermined pattern of the second polarization layer 1108b. Finally, the mask 1100c is formed, wherein the etch stop layer 1106 is patterned.

In one embodiment of the present invention, the substrate 1102 may comprise a transparent substrate such as a glass substrate or a quartz substrate. In addition, the material of the first polarization layer 1104 or the second polarization layer 1108 may comprises calcium fluoride ($CaF_2$), magnesium fluoride ($MgF_2$), or lithium fluoride (LiF).

It is noted that the polarization direction of the first polarization layer 1104 and the second polarization layer 1108 may not be limited to the embodiment described above. In one embodiment of the present invention, the polarization direction of the first polarization layer 1104 and the second polarization layer 1108 are mutually perpendicular.

Accordingly, in the present invention, since the polarization direction of the first polarization layer and the patterned second polarization layer are mutually perpendicular, the resolution of the light for exposing the photoresist layer is excellent due to the unexpected TM polarization light is eliminated. In addition, the mask of the present invention is chromium free and will not pollute the environment. Therefore, the mask of the present invention may be provided with the conventional light source and the high numerical aperture (NA) illumination to achieve narrower line width and critical dimension.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A mask of a lithographic process, comprising:
   a substrate;
   a first polarization layer for allowing a transmission of a first polarization direction of light and avoiding a transmission of a second polarization direction of light, wherein the first polarization layer at which the first polarization direction of light is transmitted through is unpatterned;
   a second polarization layer for avoiding a transmission of the first polarization direction of light, wherein the second polarization layer is patterned with a predetermined pattern and the predetermined pattern of the second polarization layer of the mask is to be transferred onto the photoresist layer;
   wherein the mask is chromium-free.

2. The mask of claim 1, wherein the first polarization direction of light and the second polarization direction of light are mutually perpendicular.

3. The mask of claim 1, wherein the first polarization direction of light comprises a traverse electric (TE) polarization direction of an incident light on a surface of the mask.

4. The mask of claim 1, wherein the second polarization direction of light comprises a traverse magnetic (TM) polarization direction of an incident light on a surface of the mask.

5. The mask of claim 1, wherein the substrate comprises a transparent substrate.

6. The mask of claim 5, wherein the transparent substrate comprises a glass substrate or a quartz substrate.

7. The mask of claim 1, wherein a material of the first polarization layer or the second polarization layer comprises calcium fluoride ($CaF_2$), magnesium fluoride ($MgF_2$), or lithium fluoride (LiF).

8. A method of manufacturing a chromium free mask of a lithographic process, comprising:
   providing a substrate;
   forming a first polarization layer over the substrate;
   forming a second polarization layer over the first polarization layer; and
   patterning the second polarization layer with a predetermined pattern that the predetermined pattern of the second polarization layer of the mask is to be transferred onto the photoresist layer;
   wherein the first polarization layer is adopted for allowing a transmission of a first polarization direction of light and avoiding a transmission of a second polarization direction of light, and the first polarization layer at which the first polarization direction of light is transmitted through is unpatterned, and the second polarization layer is adopted for avoiding a transmission of the first polarization direction of light and the mask is chromium-free.

9. The method of claim 8, wherein after the first polarization layer is formed and before the second polarization layer is formed, further comprising:
   forming an etch stop layer between the first polarization layer and the second polarization layer; and
   patterning the etch stop layer with the predetermined pattern.

10. The method of claim 8, wherein the first polarization direction of light and the second polarization direction of light are mutually perpendicular.

11. The method of claim 8, wherein the first polarization direction of light comprises a traverse electric (TE) polarization direction of an incident light on a surface of the mask.

12. The method of claim 8, wherein the second polarization direction of light comprises a traverse magnetic (TM) polarization direction of an incident light on a surface of the mask.

13. The method of claim 8, wherein the substrate comprises a transparent substrate.

14. The method of claim 13, wherein the transparent substrate comprises a glass substrate or a quartz substrate.

15. The method of claim 8, wherein a material of the first polarization layer or the second polarization layer comprises calcium fluoride ($CaF_2$), magnesium fluoride ($MgF_2$), or lithium fluoride (LiF).

16. A lithographic process, comprising:
providing an incident light;
providing a mask, wherein the mask comprising:
 a substrate;
 a first polarization layer for allowing a transmission of a first polarization direction of the incident light and avoiding a transmission of a second polarization direction of the incident light, wherein the first polarization layer at which the first polarization direction of light is transmitted through is unpatterned;
 a second polarization layer for avoiding a transmission of the first polarization direction of the incident light, wherein the second polarization layer is patterned with a predetermined pattern and the predetermined pattern of the second polarization layer is to be transferred onto the photoresist layer;
wherein the mask is chromium-free.

17. The lithographic process of claim 16, wherein the first polarization direction of light and the second polarization direction of light are mutually perpendicular.

18. The lithographic process of claim 16, wherein the first polarization direction of light comprises a traverse electric (TE) polarization direction of the incident light.

19. The lithographic process of claim 16, wherein the second polarization direction of light comprises a traverse magnetic (TM) polarization direction of the incident light.

20. The lithographic process of claim 16, wherein the substrate comprises a transparent substrate.

21. The lithographic process of claim 20, wherein the transparent substrate comprises a glass substrate or a quartz substrate.

22. The lithographic process of claim 16, wherein a material of the first polarization layer or the second polarization layer comprises calcium fluoride ($CaF_2$), magnesium fluoride ($MgF_2$), or lithium fluoride (LiF).

23. The lithographic process of claim 16, wherein the incident light is generated by an annular light generator.

24. The lithographic process of claim 16, wherein the incident light is generated by a dipole light generator.

25. The lithographic process of claim 16, wherein a resolution of line/space dimension or critical dimension of about 90 nm is generated by using the incident light comprising a wavelength of about 248 nm.

26. The lithographic process of claim 16, wherein a resolution of line/space dimension or critical dimension of about 65 nm is generated by using the incident light comprising a wavelength of about 193 nm.

* * * * *